United States Patent
Linliu

[11] Patent Number: 6,165,909
[45] Date of Patent: Dec. 26, 2000

[54] METHOD FOR FABRICATING CAPACITOR

[75] Inventor: Kung Linliu, Hsinchu, Taiwan

[73] Assignee: Worldwide Semiconductor Manufacturing Corp., Hsinchu, Taiwan

[21] Appl. No.: 09/306,095

[22] Filed: May 6, 1999

[30] Foreign Application Priority Data

Mar. 19, 1999 [TW] Taiwan ................................ 88104323

[51] Int. Cl.[7] .................................................. H01L 21/302
[52] U.S. Cl. .......................... 438/720; 438/733; 438/742
[58] Field of Search ................................ 438/706, 720, 438/733, 742

[56] References Cited

U.S. PATENT DOCUMENTS

| | | | |
|---|---|---|---|
| 5,429,978 | 7/1995 | Lu et al. | 437/52 |
| 5,429,979 | 7/1995 | Lee et al. | 437/52 |
| 5,547,893 | 8/1996 | Sung | 437/52 |
| 5,688,713 | 11/1997 | Linliu et al. | 437/60 |
| 5,706,164 | 1/1998 | Jeng | 361/321.4 |
| 5,792,689 | 8/1998 | Yang et al. | 438/253 |
| 5,893,734 | 4/1999 | Jeng et al. | 438/239 |
| 6,001,717 | 12/1999 | Lien | 438/586 |
| 6,037,217 | 3/2000 | Linliu | 438/253 |

*Primary Examiner*—Robert Kunemund
*Assistant Examiner*—Charlotte A. Brown
*Attorney, Agent, or Firm*—J.C. Patents; Jiawei Huang

[57] ABSTRACT

A method for fabricating a capacitor is described. A dielectric layer and a polysilicon layer thereon are provided. A patterned oxide layer and spacers on the sidewalls of the patterned oxide layer are formed. The polysilicon layer is etched using the oxide layer and spacer as an etching mask. The oxide layer and spacer are then removed. A dielectric layer and a conductive layer are sequentially formed on the polysilicon layer.

19 Claims, 3 Drawing Sheets

METHOD FOR FABRICATING CAPACITOR

CROSS-REFERENCE TO RELATED APPLICATION

This application claims the priority benefit of Taiwan application Ser. No. 88104323, filed Mar. 19, 1999, the full disclosure of which is incorporated herein by reference.

BACKGROUND OF THE INVENTION

1. Field of the Invention

The invention relates to a semiconductor process. More particularly, the invention relates to a method for fabricating capacitors.

2. Description of the Related Art

The capacitor area of a DRAM capacitor is more critical at the 64 Mb level and beyond, as the design rule of the DRAM is tighter. Because a crown-shape capacitor has a large capacitor area, it is preferably used in a DRAM capacitor to increase the capacitance. However, fabrication of the crown-shape capacitor is very complex. Therefore, a simple method is needed to fabricate capacitors with a large capacitor area. cl SUMMARY OF THE INVENTION In one aspect, the present invention provides a method for fabricating capacitors suitable for use in a dielectric layer having a first and a second opening. The first and the second openings are filled with a polysilicon layer that covers the dielectric layer. An oxide pattern having sidewalls is formed over the polysilicon layer. The oxide pattern exposes a first region, a second region and a third region of the polysilicon layer. The third region is located between the first and the second regions and aligned over a position between the first and second openings. On the sidewalls of the oxide pattern, spacers are formed to reduce areas of the first, the second, and the third regions. The spacers and the oxide pattern thus result in a first, a second, and a third windows exposing portions of the polysilicon layer, wherein the first and the second windows are both narrower than the third window positioned between them. The polysilicon layer is etched using the spacers and the oxide pattern as an etching mask until forming a trench that exposes the dielectric layer between the first and the second openings. A dielectric layer is formed over the polysilicon layer. A conductive layer is formed over the dielectric layer.

The spacers are formed to reduce the width of the windows. According to a micro-loading effect, the narrow windows facilitate the increase of the area of capacitors.

In another aspect, the present invention provides a method of fabricating storage nodes. A dielectric layer having a first opening and a second opening is provided. The first and the second openings are filled with a polysilicon layer that covers the dielectric layer. An oxide pattern having sidewalls is formed over the polysilicon layer. The oxide pattern exposes at least a first region, a second region and a third region of the polysilicon layer. The third region is located between the first and the second regions and aligned over a position between the first and second openings. On the sidewalls of the oxide pattern, spacers are formed to reduce areas of the first, the second, and the third regions. The spacers and the oxide pattern have a first, a second, and a third windows exposing portions of the polysilicon layer, wherein the first and the second windows are both sufficiently narrower to cause an etching rate of the polysilicon layer beneath the first and the second windows slower than that beneath the third window. The polysilicon layer is etched using the spacer and the oxide pattern as an etching mask until forming a trench to expose the dielectric layer between the first and the second openings.

It is to be understood that both the foregoing general description and the following detailed description are exemplary and explanatory only and are not restrictive of the invention, as claimed.

DESCRIPTION OF THE PREFERRED EMBODIMENTS

In an etching step, micro-loading effect often must be eliminated because it makes an etching endpoint hard to determine. However, the present invention uses the micro-loading effect to accomplish a simple method for fabricating capacitors. Because the present invention applies this surprising use, it is unexpected by persons skilled in the art.

FIGS. 1A–1F are schematic, cross-sectional views for illustrating steps taken in the method for fabricating a capacitor according to the present invention.

Figure 1A:
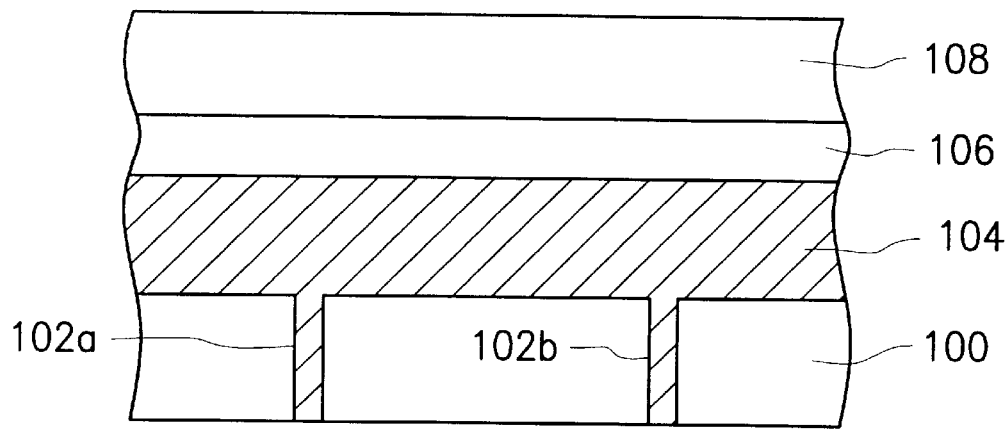
FIGS. 1A–1F are schematic, cross-sectional views for illustrating steps taken in the method for fabricating a capacitor according to the present invention.

As shown in FIG. 1A, a dielectric layer 100 has a first opening 102a and a second opening 102b. The number of openings is not limited to be two and can be adjusted for the purpose to optimize each process. The first and second openings 102a, 102b are filled with a polysilicon layer 104 that covers the dielectric layer 100. A hard mask layer 106 and a photoresist layer 108 are sequentially formed over the polysilicon layer 104. In this embodiment, an oxide layer 106 is formed to serve as the hard mask layer 106. One portion of polysilicon layer 104 close to the first opening 102a is predetermined to form a first storage node, whereas another portion of polysilicon layer 104 close to the second opening 102b is predetermined to form a second storage node.

Figure 1B:
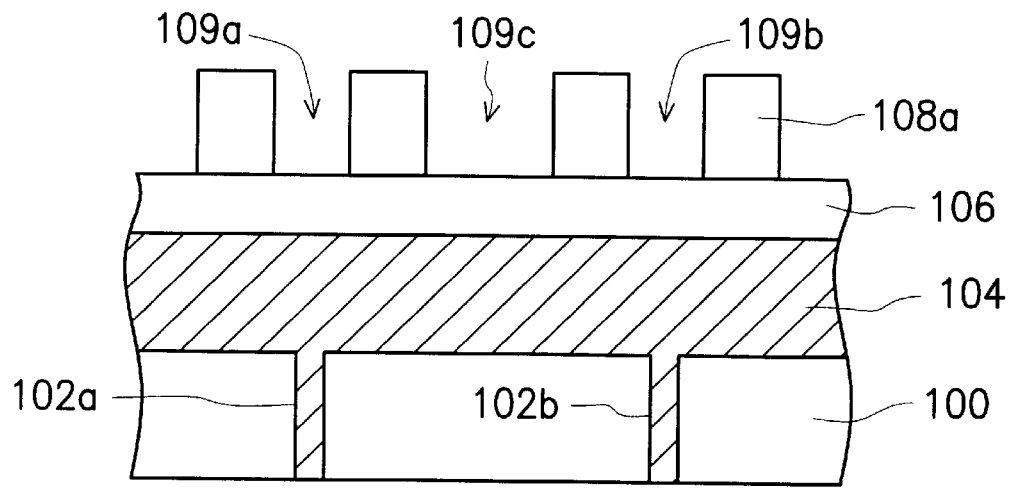

As shown in FIG. 1B, the photoresist layer (108 shown in FIG. 1A) becomes a photoresist pattern 108a in a photolithography step. The photoresist pattern 108a has a first, a second, and a third hollow 109a, 109b, 109c. Among the hollows, the first hollow 109a and the second hollow 109b are aligned substantially over the first opening 102a and the second opening 102b, respectively. The third hollow 109c between them is aligned over a position between the first and the second openings 102a, 102b, while the first hollow 109a and the second hollow 109b are not limited to aligned exactly over the first opening 102a and the second opening 102b, respectively. Each of the first and the second hollows has a width of about 0.2 micrometers. The third hollow 109c has a width of about 0.4micrometers greater than that of each of the first and the second hollows 109a, 109b. The widths as just mentioned are preferred examples suitable for a 0.25 micrometers process or a 64 Mb DRAM process. They can be adjusted to optimize each process.

Figure 1C:
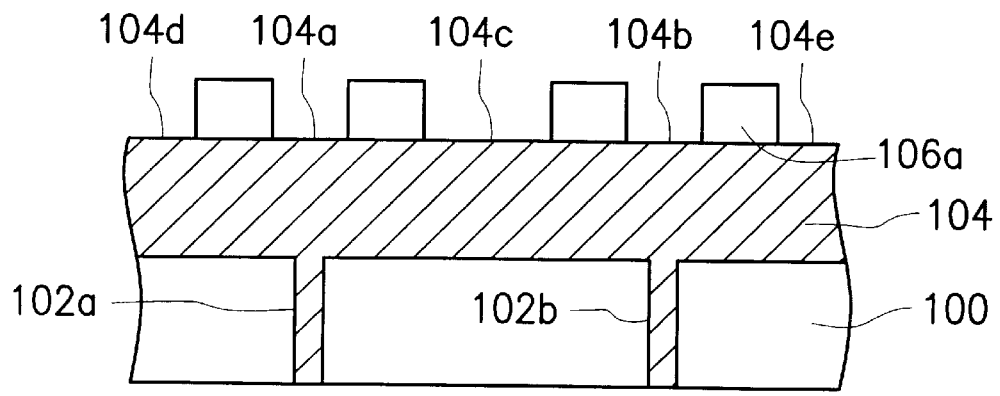

As shown in FIG. 1C, the oxide layer (106 shown in FIG. 1B) is etched to have sidewalls exposed using the photoresist pattern (108a shown in FIG. 1B) as an etching mask. The etched oxide layer is indicated by a reference number 106a. This etching step is performed to expose portions of the polysilicon layer 104. In this embodiment, the polysilicon layer 104 has five exposed regions consisting of a first region 104a, a second region 104b, 104c, 104d and 104e. Among the hollows, the first region 104a and the second region 104b are aligned substantially over the first opening 102a and the second opening 102b, respectively. The third region 104c is located between the first and the second regions 104a, 104b and aligned over a position between the first and second openings 102a, 102b. The third region 104c between them is aligned substantially over the position between the first and the second openings 102a, 102b, the first region 104a and the second region 104b are not limited to aligned exactly over the first opening 102a and the second opening 102b, respectively. On the two sides thereof, the polysilicon layer 104 further has the fourth and the fifth exposed regions 104d, 104e, each of which is broader than that of each of the first and the second regions 104a, 104b. The photoresist pattern 108a is removed after this etching step.

Figure 1D:
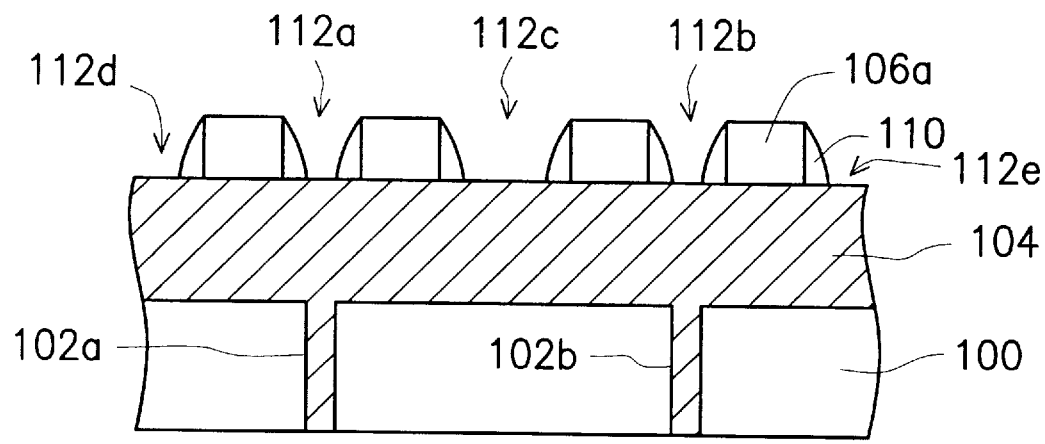

As shown in FIG. 1D, on the sidewalls of the oxide layer 106a, spacers 110 are formed to reduce areas of the regions 104a, 104b, 104c, 104d, 104e of the polysilicon layer 104. The spacers 110 is formed by, for example, depositing another oxide layer (not shown) with a thickness sufficient to cover the patterned oxide layer 106a and the polysilicon layer 104, followed by using a reactive-ion etching method to anisotropically etch the deposited oxide layer. The oxide layer is deposited, for example, to a thickness of about 500 to 800 angstroms. This etching step is performed until the polysilicon layer 104 is exposed, whereby the spacers 110 are accomplished. Each of the spacers 110 has a width of about 500 angstroms.

After the areas of the regions 104a, 104b, 104c, 104d, 104e are reduced by the spacers 110, the regions 104a, 104b, 104c, 104d, 104e and the spacers 110 thereon constitute five windows consisting of a first window to a fifth window 112a, 112b, 112c, 112d, 112e. Corresponding the first and the second polysilicon regions 104a, 104b (shown in FIG.1C) respectively, each of the first and the second windows 112a, 112b, has a width of about 0.1 micrometers. Positioned between the first and second windows 11 2a, 102b, the third window 112c has a width of about 0.3micrometers greater than that of each of the first and the second windows 112a, 112b. On the two sides of the polysilicon layer 104, each of the fourth and the fifth windows 112d, 112e has a width broader than that of each of the first and the second windows 112a, 112b.

Figure 1E:
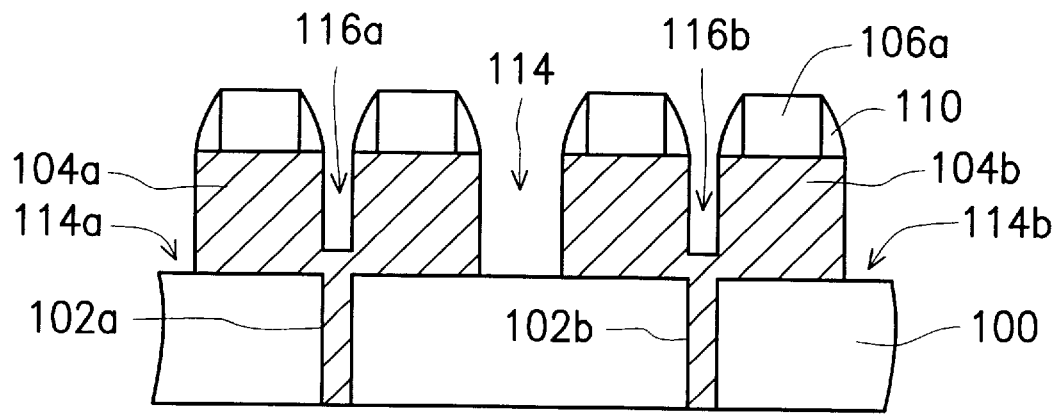

As shown in FIG. 1E, the polysilicon layer 104 (shown in FIG. 1D) is etched using the oxide layer 106a as well as the spacers 110 as an etching mask. This etching step is performed until a trench 114 is formed to expose the dielectric layer 100 beneath the third window 112c (shown in FIG. 1D), whereby a first side trench 114a and a second side trench 114b also expose the two sides of the dielectric layer 100. Beneath the first window 112a (shown in FIG. 1D), a first concave 116a is also formed when the trench 114 is accomplished. Beneath the second window 112b, a second concave 116b is also formed when the trench 114 is accomplished. Each of the formed concaves 116a, 116b has a depth less than that of the trench 114. In other words, the trench 114 divides the polysilicon layer 104 into two portions of which the first portion 104a having the first concave 116a serves as the first storage node, and of which the second portion 104b having the second concave 116b serves as the second storage node.

Both of the first and second windows 112a, 112b (shown in FIG. 1D) are much narrower than each of the third, the fourth and the fifth windows 112c, 112d, 112e. Such width difference between the first to the fifth windows 112a, 112b, 112c, 112d, 112e is especially suitable for applying the micro-loading effect. According to the micro-loading effect, the etching rate of the polysilicon layer 104 beneath a narrow window is slower than that of the polysilicon layer 104 beneath a broad one. Therefore, the polysilicon layer 104 beneath the first and the second concaves 116a, 116b still has a surface level higher than the dielectric layer 100, as shown in FIG. 1E. The polysilicon layer 104 has the surface level beneath the first concave 116a but over the dielectric layer 100 maintains an electrical connection of the first storage node, while the polysilicon layer 104 beneath the second concave 116b but over the dielectric layer 100 maintains an electrical connection of the second storage node.

Each of the storage nodes, which are called a twin storage node, comprises two blocks of polysilicon. The number of blocks is not limited to two. If a suitable spacer and a suitable photolithography technique are applied, more than three blocks of polysilicon can be formed to increase the capacitor region.

Figure 1F:
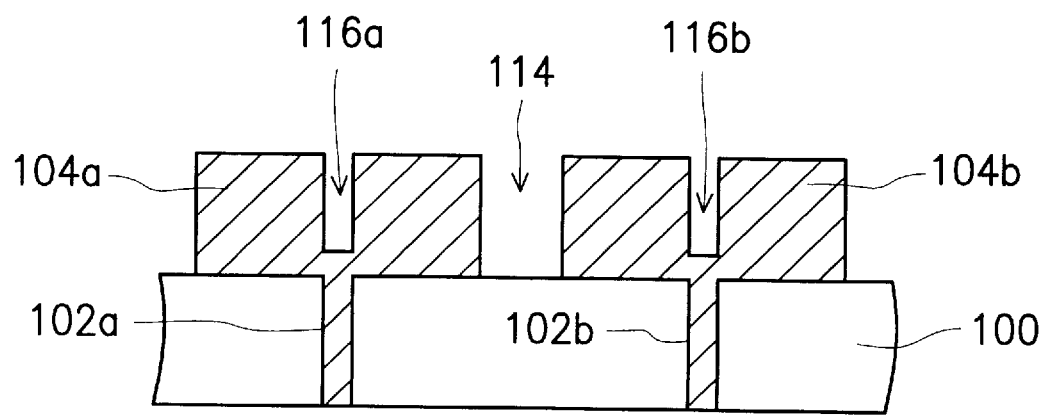

As shown in FIG. 1F, the spacer (110 shown in FIG. 1E) and oxide layer (106a shown in FIG. 1E) are removed.

Figure 2:
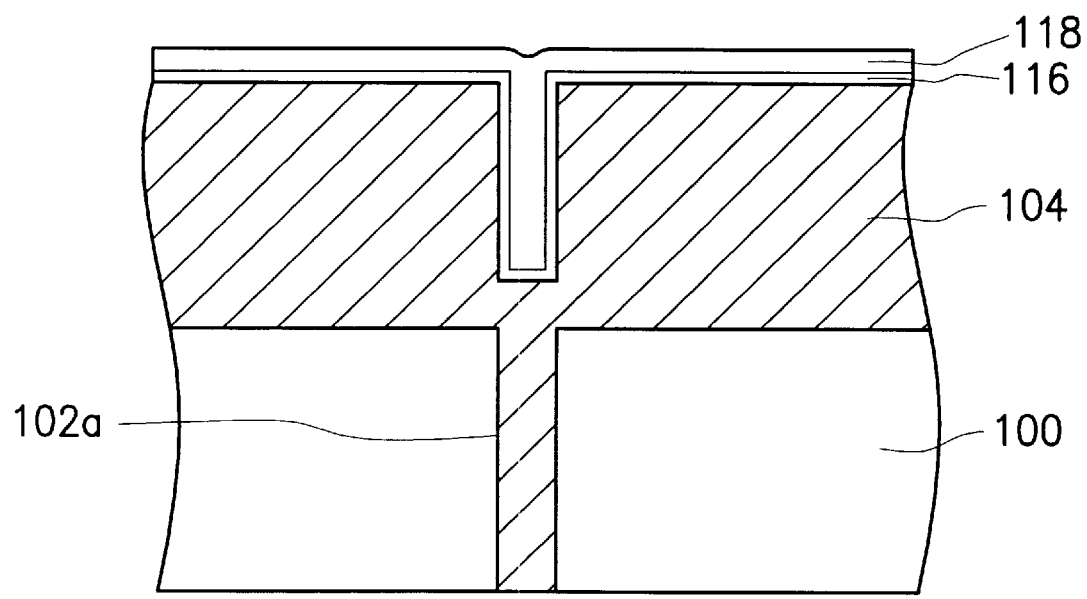
FIG. 2 is a schematic, cross-sectional view of a capacitor comprising an ONO layer and conductive layer according to the present invention.

After the removing step, an oxide/nitride/oxide (ONO) layer and a conductive layer are sequentially formed over the storage nodes to accomplish the capacitors. Such formation steps are well known of persons skilled in the art. Examples of the ONO layer and conductive layer are shown in FIG. 2. They are represented by reference number 116 and reference number 118, respectively.

The present invention has many advantages, comprising:

1. The present invention provides a method simpler than the conventional method for fabricating capacitors with large capacitor region. The storage nodes of the capacitors can be formed simultaneously by using only a single etch recipe, because the present invention uses the micro-loading effect. Micro-loading effect occurs under circumstance that a window has a width narrow enough.
2. The spacer is formed to adjust the width of a window so as to facilitate applying the micro-loading effect. According to the micro-loading effect, the narrow windows facilitate the increase of the capacitor area.
3. In this present invention, only one photolithography step is used, while the conventional method requires at least two photolithography steps. Therefore, disadvantages such as misalignment caused during the photolithography step can be minimized to obtain a higher reliability and performance of devices.
4. In this invention, a hard mask is formed instead of using a soft mask layer such as a photoresist pattern. If a soft mask layer is used to define windows, it is required to has a larger thickness to consequently cause a higher aspect ratio of the windows. Therefore, a hard mask layer which can be formed with a smaller thickness is used to advantage a fabrication process such as an etching processes or a deposition process in this invention.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for fabricating capacitors suitable for use with a dielectric layer having a first and a second openings, the first and the second openings being filled with a polysilicon layer that covers the dielectric layer, the method comprising:

forming an oxide pattern having sidewalls over the polysilicon layer;

forming a spacer on each of the sidewalls of the oxide pattern, the polysilicon layer being exposed by a plurality of windows between the spacers, wherein the windows aligned over a position between the first and the second openings are sufficiently wider than the windows substantially aligned over the first and the second windows to result in different etching rates of the polysilicon layer exposed by different windows;

etching the polysilicon layer using the spacer and the oxide pattern as an etching mask until a trench is formed to expose the dielectric layer between the first and the second openings to result in two isolated storage nodes extending from the first and the second openings;

forming a dielectric layer over the polysilicon layer; and forming a conductive layer over the dielectric layer.

2. The method of claim 1, wherein the spacer is made of oxide.

3. The method of claim 1, wherein each of the windows substantially aligned over the first and the second windows has a width of about 0.1 micrometers.

4. The method of claim 1, wherein each of the windows aligned over a position between the first and the second openings has a width of about 0.3 micrometers.

5. The method of claim 1, wherein the spacer has a width of about 500 angstroms.

6. A method for fabricating storage nodes suitable for a dielectric layer having a first and a second openings, the first and the second openings being filled with a polysilicon layer that covers the dielectric layer, the method comprising:

forming an oxide pattern having sidewalls over the polysilicon layer;

forming spacers on the sidewalls of the oxide pattern, the spacers and the oxide pattern having a first, a second, and a third window exposing the polysilicon layer, wherein the first and the second windows are both narrower than the third window positioned between the first and the second windows; and etching the polysilicon layer exposed by the first, the second and the third windows until the third window exposes a top surface of the dielectric layer while the remaining polysilicon layer exposed by the first and the second windows still has a surface level higher than the top surface of the dielectric layer, using the spacer and the oxide pattern as an etching mask until forming a trench to expose the dielectric layer between the first and the second openings, whereby the trench divides the polysilicon layer into two portions.

7. The method of claim 6, wherein the spacer is made of oxide.

8. The method of claim 6, wherein the first window has a width of about 0.1 micrometers.

9. The method of claim 6, wherein the second window has a width of about 0.1 micrometers.

10. The method of claim 6, wherein the third window has a width of about 0.3 micrometers.

11. The method of claim 6, wherein the spacer has a width of about 500 angstroms.

12. The method of claim 6, wherein the oxide pattern is formed by a process comprising:

forming an oxide layer over the polysilicon layer;

forming a photoresist pattern over the oxide layer etching the oxide layer using the photoresist pattern as an etching mask; and removing the photoresist pattern.

13. The method of claim 12, wherein the photoresist pattern is formed by a process comprising a photolithography step.

14. A plurality of storage nodes made by a process comprising:

providing a dielectric layer having a first and a second openings, the first and the second openings being filled with a polysilicon layer that covers the dielectric layer;

forming an oxide pattern having sidewalls over the polysilicon layer;

forming spacers on the sidewalls of the oxide pattern, between the spacers having a first, a second, and a third window exposing the polysilicon layer, wherein the first and the second windows are both narrower enough than the third window positioned between them to cause a micro-loading effect; and etching the polysilicon layer using the spacer and the oxide pattern as an etching mask until forming a trench to expose the dielectric layer between the first and the second openings, whereby the trench divides the polysilicon layer into two portions.

15. The storage nodes as claimed in claim 14, wherein the spacer is made of oxide.

16. The storage nodes as claimed in claim 14, wherein the first window has a width of about 0.1 micrometers.

17. The storage nodes as claimed in claim 14, wherein the second window has a width of about 0.1 micrometers.

18. The storage nodes as claimed in claim 14, wherein the third window has a width of about 0.3 micrometers.

19. The storage nodes as claimed in claim 14, wherein the spacer has a width of about 500 angstroms.

* * * * *